(12) United States Patent
Syau et al.

(10) Patent No.: US 6,306,771 B1
(45) Date of Patent: Oct. 23, 2001

(54) PROCESS FOR PREVENTING THE FORMATION OF RING DEFECTS

(75) Inventors: Tsengyou Syau, Portland, OR (US); James R. Shih, Cupertino, CA (US); Shih-Ked Lee, Beaverton; Timothy P. Kay, St. Helens, both of OR (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/384,752

(22) Filed: Aug. 27, 1999

(51) Int. Cl.[7] ................................................. H01L 21/302
(52) U.S. Cl. .................... 438/706; 438/708; 438/720; 438/723; 438/742; 438/743
(58) Field of Search ..................................... 438/706, 708, 438/717, 720, 723, 725, 742, 743, 737

(56) References Cited

U.S. PATENT DOCUMENTS

| | | | |
|---|---|---|---|
| 5,319,247 | 6/1994 | Matsuura | 257/760 |
| 5,665,641 | * 9/1997 | Shen et al. | 438/643 |
| 5,688,717 | 11/1997 | Shen et al. | 437/190 |
| 6,093,373 | * 7/2000 | Ngo et al. | 257/797 |

OTHER PUBLICATIONS

E.G. Colgan, et al., "Formation Mechanism of Ring Defects During Metal RIE", VMIC Conference 1994 ISMIC (103/94/0284) Jun. 7–8, 1994 (pp. 284–286).

* cited by examiner

Primary Examiner—Benjamin L. Utech
Assistant Examiner—Binh X. Tran
(74) Attorney, Agent, or Firm—Skjerven Morrill MacPherson, LLP

(57) ABSTRACT

The prevention of the formation of undesired defects formed during the etching of etched metal interconnect lines on an integrated circuit during an integrated circuit manufacturing process that involves laying down on a semiconductor wafer a thin film such as an anti-reflective coating (ARC) on a layer of metal to be patterned into the metal interconnects of the individual integrated circuits. To do this the anti-reflective coating layer is covered with an oxide layer prior to applying and patterning subsequent photoresist. The specific metalization layer disclosed can be of aluminum, copper or copper-aluminum alloy. The ARC as disclosed is a nitride layer, such as titanium nitride. The oxide may be formed on the ARC in a number of known ways and may be etched subsequently alone or in combination with the underlying ARC and metal after subsequent photoresist deposit upon the oxide layer.

11 Claims, 1 Drawing Sheet

PROCESS FOR PREVENTING THE FORMATION OF RING DEFECTS

BACKGROUND OF THE INVENTION

1. Field of the Invention

The present invention relates to a method of preventing the formation of ring defects during the etching of a metalization layer after the formation of an Anti-Reflective Coating ("ARC") layer over the metal layer in preparation for patterning and etching the metal layer to form the desired metalization.

2. Description of Related Art

It is well known in the art to form an ARC layer over a layer of metal in preparation to patterning prior to etching the metalization pattern from the metal layer. The ARC layer may be of a very different coefficient of thermal expansion (CTE) than the metal layer, and is deposited at an elevated temperature. As a result the metal shrinks more than the ARC as the device cools. The ARC layer being relatively much thinner than the metal layer and much more hard and brittle is caused to crack. This cracking allows the photoresist developer in the subsequent patterning steps to seep through the overlying ARC layer and chemically react with the underlying metal. This has been found to leave behind generally cylindrical or ring-like deposits of the metal or an alloy or compound of the metal in places where the patterning should have resulted in etching away the metal. As line/space dimensions become increasingly smaller, e.g., in the sub-micron range, these defects increasingly cause low yields in the manufacture of integrated circuits using such metalization processes. The rings/cylinders form defects close enough to respective adjacent metalization lines to form shorts.

E. G. Colgan, B. Greco and J. F. White have reported upon such a phenomenon in "FORMATION MECHANISM OF RING DEFECTS DURING METAL RIE", 1994 VMIC Conference, ISMIC (June, 1994), the disclosure of which is incorporated herein by reference. This paper deals with the deposition of a titanium nitride ARC layer over an aluminum metalization layer comprising a copper-aluminum alloy of 0.5 to 1% copper deposited on a titanium layer and covered by a titanium layer ("Ti/Al(Cu)/Ti/TiN" or "TACT"). The authors there reported that the rings resulted from holes formed in the TiN after it was deposited due to the brittle nature of TiN and the large difference in the Coefficient of Thermal Expansion ("CTE") between the two substances. For example the authors noted that Al had a CTE of 24 ppm/° C. and TiN had a CTE of 9.3 ppm/° C. These holes formed by the splitting and cracking of the TiN layer allow the subsequent utilized photoresist developer to prematurely etch the Al in undesired places where the photoresist developer is exposed to the TiN layer in the process of patterning the metalization etching mask over the metal layer. Subsequently, according to this paper, the etched aluminum deposit is oxidized during rinse and forms Aluminum Oxide, $Al_2O_3$, in cylindrical or ring-like shapes in a pocket under such a hole formed in the TiN. This aluminum oxide formation then masks a further etching step, e.g., through Reactive Ion Etching ("RIE"), producing the rings of mostly aluminum in the fields where no metal should be. The authors did not suggest a solution.

Applicants have experienced very similar problems in using a TiN ARC over a layer of metal formed of aluminum copper alloy in metalizing integrated circuits having sub-micron dimensions. The TiN has been placed upon the metal layer as an ARC at typically a temperature of 350° C. or more. Because of the relatively large grain size of the Al-Cu alloy and the large difference in the CTE between the Al-Cu alloy and the TiN, the ring defects referenced in the above-noted paper are occurring in Applicants' process. Aluminum is first deposited on the wafer at 400° C. in the I.C. manufacturing process. The wafer then is moved to the TiN deposition chamber, and the TiN is deposited at a starting temperature of above 350° C. Depending upon the deposition thickness of the TiN, the final temperature in the chamber can be above 500° C. Subsequently, as the stack of metal and ARC film cools, the aluminum shrinks much more than the ARC and the resultant grain collapse causes the harder and more brittle ARC to crack and split.

SUMMARY OF THE INVENTION

The present invention, therefore, provides a method for avoiding the ill effects of the cylinder/ring formation without compromising the necessary and beneficial effects of forming the ARC layer over the metal layer prior to patterning the metal layer for etching. The desired very small dimension metalization forming the electrical interconnections across the upper layers of the integrated circuit being manufactured can then be formed without the cylinder/ring formations of the prior art.

In accordance with the invention the anti-reflective coating layer is covered with an oxide layer prior to applying and patterning subsequent photoresist. The oxide layer is of a thickness to seal any cracks or splits in the underlying anti-reflective coating. This prevents seepage of the photoresist developer through any holes through the TiN layer formed by such cracks or splits and prevents the unwanted formation of the aluminum oxide micro masks that mask the subsequent metal etching step in undesired places, forming the ring or cylinder-like defects. The specific metalization layer can be of aluminum, copper or copper-aluminum alloy. The ARC layer may be a nitride layer, such as titanium nitride. The oxide may be formed on the ARC in a number of known ways and may be etched subsequently alone or in combination with the underlying ARC layer and metal layer after a subsequent photoresist deposit upon the oxide layer.

BRIEF DESCRIPTION OF THE DRAWINGS

The Figures are not necessarily drawn to scale in thickness, but are for illustration of the concepts of the present invention only. Like numeral in the Figures denote the same or like elements.

DETAILED DESCRIPTION OF THE PREFERRED EMBODIMENTS

Figure 1A:
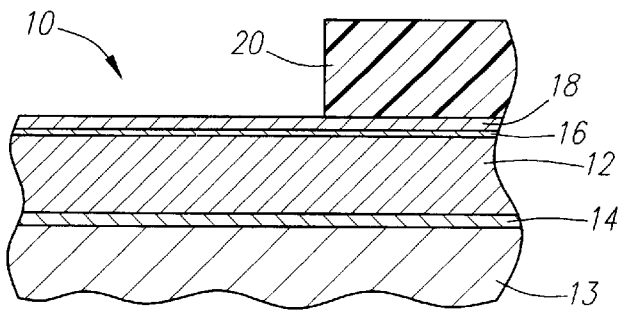
FIG. 1A shows a cross-sectional view of the location of a cap oxide layer according to the present invention, with developed photoresist remaining over a portion of the cap oxide layer after the developing step.

Turning to FIG. 1A, there is shown a structure formed in the manufacture of an integrated circuit 10. The structure is formed by the deposition of a relatively thin, 400 Å Anti-Reflective coating ("ARC") layer 16 of TiN on a layer 12 of metal formed of an Al-Cu alloy having up to at least 0.5% copper. The metal layer 12 may be formed over a barrier layer 14 of TiN/Ti which in covers another layer of insulating oxide formed for example from tetraethyl orthosilicate ("TEOS"). Without further action, as is known in the art, after the ARC layer 16 cracks in many and diverse locations as the metal layer 12 and ARC layer 16 cool, the subsequent processing will result in the cylinder/ring defect formations. The barrier layer 14 is formed using an Applied Materials ENDURA PVD tool depositing between 200 Å and 1200 Å at between room temperature and 200° C. The metal layer 16 is deposited at between 350° C. and 450° C. using the same PVD tool to have a thickness between 4000 Å and 7000 Å and the ARC layer is likewise deposited with the same tool at between room temperature and 200° C. to have a thickness between 200 Å and 500 Å.

According to the present invention, a layer 18 of about 200 Å of a cap-forming oxide is laid down or grown on the TiN ARC layer 16. This cap oxide layer 18 may be deposited by any known means, such as silicon rich oxide (silane) or it may be formed from tetraethyl orftiosilicate ("TEOS") or any other method as is known in the art.

The cap oxide layer 18 of silicon dioxide is grown or deposited in such a fashion as to be thick enough to seal cracks that have developed in the TiN ARC layer 16 and to thereby prevent chemicals such as photoresist developer from passing through such cracks and chemically interacting with the metal in the underlying metal layer 12, e.g. to a thickness of about 200 Å using a Novellus PECVD tool at between 300° C. and 400° C.

Subsequent etching is also performed in a novel fashion. The location of the cap oxide 18 relative to the incomplete interconnect structure is shown in FIG. 1A with the remaining photoresist 20, left over after the photoresist 20 development and wash steps, covering portions of the cap oxide layer 18. Photoresist 20 has been formed into the appropriate pattern using a photoresist mask.

Figure 1B:
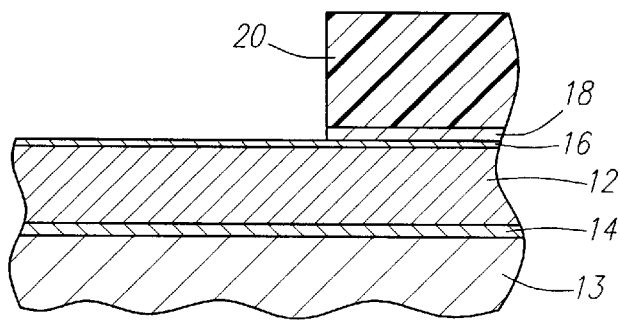
FIG. 1B shows a cross-sectional view of the results of a subsequent etch of the cap oxide layer, according to the current invention.
Figure 1C:
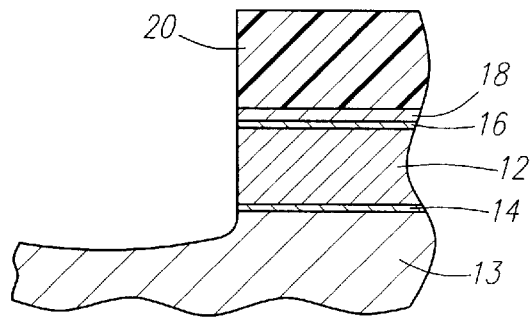
FIG. 1C shows a cross-sectional view of the structure remaining after the subsequent etch of the TiN and metal layers, prior to the removal of the photoresist pattern above the remaining portions of the oxide layer in accordance with the present invention; and, FIG. 1D shows a cross-sectional view of the result of the deposition of a further oxide insulator layer on the structure of FIG. 1C (after removal of the photoresist) in preparation for further processing of metalization layers or as the sealant for the top layer of metalization in accordance with the present invention.
Figure 1D:
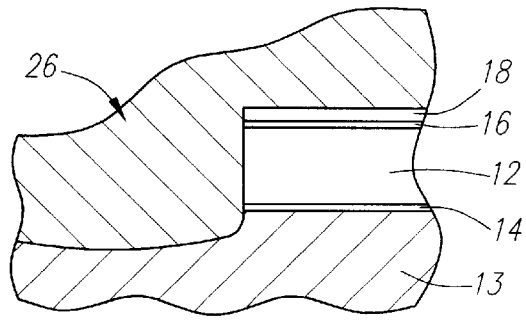

The protective cap oxide layer 18 may be etched in any one of several different ways. The oxide layer 18 may be etched first using an oxide etchant, followed by a separate etch of the ARC layer 16 and the metal layer 12. For example, one may use a standard dry etchant, such as, $CH_4$, $CHF_3$, $N_2$ etchant, in an appropriate reactive ion etching reactor, to first etch the oxide layer 18, resulting in the structure of FIG. 1B. This etch advantageously is more selective to the ARC layer 16 and metalization layer 12, such that the ARC layer 16 then acts as an etch stop. Thereafter separate etching (typically also dry etching) of the ARC layer 16 and metal layer 12 can occur, which will have the effect of etching through the TiN/Ti barrier layer 14 and partially through the TEOS layer 13, leaving the structure shown in FIG. 1C. The photoresist 20 forming 20 the mask is then removed. An insulative oxide layer 26 is then deposited on the structure of FIG. 1C (subsequent to the removal of the photoresist 20) to form the structure of FIG. 1D in preparation to the formation of an additional metal layer. Alternatively, insulating oxide layer 26 may form the final sealant for the integrated circuit 10 after all metalization layers are formed, as appropriate for multilevel metalization processes.

Alternatively, the cap oxide layer 18 can be etched along with the ARC layer 18 and the metal layer 12. An etchant recipe useful here consists of BC13, Ar, $N_2$, and $Cl_2$. However, this recipe is not very good for selectivity towards alumina, which may result in an uneven topography and subsequent planarization problems. Applicants' employer is the assignee on a patent application Ser. No. 09/040480, filed on Mar. 17, 1998, the disclosure of which is hereby incorporated by reference.

As is known in the art this insulating oxide layer 26 may be polished down to a new planarized level, as necessary for planarization requirements of the metalization processing in question. To the extent that this insulative oxide layer 26 is deposited/grown in a different fashion than the cap oxide layer 18 (e.g., the difference between using silane or TEOS) these oxides may be distinguishable after the planarization.

As skilled practitioners will by now understand, the present invention provides a method of manufacturing integrated circuits having an anti-reflective coating over a layer of metal, which is to be patterned into a metalization layer of metal interconnects, which solves certain problems of the prior art.

Although specific preferred embodiments of the present invention have been described and illustrated, those skilled in the art will appreciate that various modifications, additions and substitutions to these embodiments are possible, depending on the particular problem at hand, without departing from the scope and spirit of the invention, as defined by the accompanying claims. For example the metal layer maybe other metals, e.g., all copper or all aluminum metal or other copper-metal alloys. Other thin films may be deposited on the metal layer, including other anti-reflective coatings.

We claim:

1. A method of preventing the formation of ring defects during the formation of etched metal interconnect lines on an integrated circuit resulting from a manufacturing process including laying down on a semiconductor wafer a metal layer, and laying down a thin-film coating on the metal layer, comprising the steps of:

covering the thin-film coating layer with an oxide layer prior to applying and patterning subsequent photoresist, wherein the oxide layer is sufficiently thick to fill in cracks in the thin-film coating layer and thereby prevent chemicals from passing through said cracks and interacting with the metal layer beneath such cracks; and etching the oxide layer, the thin-film layer and the metal layer using a single etching step.

2. The method of claim 1 wherein the thin film layer is an anti-reflective coating.

3. The method of claim 1 wherein the metal is aluminum.

4. The method of claim 1 wherein the metal is copper.

5. The method of claim 1 wherein the metal is an aluminum-copper alloy.

6. The method of claim 1 wherein the metal is an aluminum-copper alloy that contains up to about 0.5% copper.

7. The method of claim 1 wherein the thin-film coating is a nitride layer.

8. The method of claim 1 wherein the thin-film is a titanium nitride layer.

9. The method of claim 1 wherein the oxide layer is deposited using silane and oxygen.

10. The method of claim 1 wherein the oxide layer is deposited using TEOS.

11. The method of claim 1, wherein said simultaneous etching is performed with an etchant comprising $BCl_3$, Ar, $N_2$, and $Cl_2$.

* * * * *